United States Patent [19]
Lundberg et al.

[11] Patent Number: 5,511,100
[45] Date of Patent: Apr. 23, 1996

[54] METHOD AND APPARATUS FOR PERFORMING FREQUENCY DETECTION

[75] Inventors: James R. Lundberg; Charles E. Nuckolls, both of Austin, Tex.

[73] Assignee: Motorola, Inc., Schaumburg, Ill.

[21] Appl. No.: 165,685

[22] Filed: Dec. 13, 1993

[51] Int. Cl.$^6$ .................................................. H03D 3/24
[52] U.S. Cl. ........................ 375/376; 375/375; 327/141; 327/147
[58] Field of Search .................................. 375/118, 119, 375/120, 354, 371, 373, 375, 376; 307/510, 511; 455/276.2; 329/307; 328/63, 72; 327/141, 146, 147, 149, 155, 156, 158, 159

[56] References Cited

U.S. PATENT DOCUMENTS

| | | | |
|---|---|---|---|
| 3,562,661 | 2/1971 | Crumb et al. | 375/118 |
| 4,577,163 | 3/1986 | Culp | 331/1 A |
| 4,795,985 | 1/1989 | Gailbreath, Jr. | 328/155 |
| 5,057,794 | 10/1991 | Shih | 331/1 |

OTHER PUBLICATIONS

Nienhaus et al, "A Digital Phase Lock-Loop for VLSI Telecommunications Applications," IEEE Proceedings 1989-Southeastern-pp. 1216-1220.

Walters et al, "Digital Phase-Locked Loop with Jitter Bounded", IEEE Trans. on Circuits & Systems vol. 36, No. 7, Jul. 1989, pp. 980–987.

*Primary Examiner*—Stephen Chin
*Assistant Examiner*—Bryan E. Webster
*Attorney, Agent, or Firm*—Charlotte B. Whitaker

[57] ABSTRACT

A method and apparatus for performing frequency detection in an all digital phase lock loop (10). Frequency detection is accomplished using a frequency detector (11), coupled to an digitally controlled oscillator (DCO 16). The frequency detector (11) forces phase alignment of a reference clock signal to the DCO (16) output and then counts the number the DCO (16) output pulses occurring during a reference clock period. The reference clock signal enables the DCO (16) on one signal transition and detects the presence of an oscillator counter (52) output on the same reference clock signal transition, but one reference clock period later. A synchronizer (49) is used to pass the counter (52) output to ensure no metastability. The DCO (16) is then disabled to allow frequency adjustments to occur via other circuitry.

13 Claims, 4 Drawing Sheets

METHOD AND APPARATUS FOR PERFORMING FREQUENCY DETECTION

FIELD OF THE INVENTION

This invention relates generally to digital phase locked loops, and more particularly to a fast frequency detection mechanism in a digital phase locked loop system.

CROSS-REFERENCE TO RELATED APPLICATIONS

This application is related to the following applications:

1. "A METHOD AND APPARATUS FOR DETERMINING A CONSTANT GAIN OF A VARIABLE OSCILLATOR", Ser. No. 08/165,687 by Lundberg et al.;

2. "A METHOD AND APPARATUS FOR PERFORMING FREQUENCY ACQUISITION IN AN ALL DIGITAL PHASE LOCK LOOP", Ser. No. 08/165,686 by Nuckolls et al.;

3. "A METHOD AND APPARATUS FOR PERFORMING PHASE ACQUISITION AND PHASE MAINTENANCE IN AN ALL DIGITAL PHASE LOCK LOOP", Ser. No. 08/165,681 by Nuckolls et al.;

4. "A METHOD AND APPARATUS FOR PERFORMING FREQUENCY TRACKING IN AN ALL DIGITAL PHASE LOCK LOOP", Ser. No. 08/165,682 by Nuckolls et al.

All of which are filed simultaneously herewith and assigned to the assignee hereof.

BACKGROUND OF THE INVENTION

As microprocessor frequencies increase, it becomes necessary to deskew internal and external clocks. It is also desirable to run internal clocks faster than system clock rates. An analog phase-locked loop (PLL) has previously performed this clock generation function; however, as low power applications for microprocessors proliferate, techniques for the implementation of on-chip power management are required. Generally, the implementation of a PLL requires the acquisition of an appropriate frequency and phase using an internal ring oscillator. Analog phase-locked loops typically use a voltage-controlled oscillator (VCO) to generate a period signal that is "locked" to a reference clock signal.

The frequency of the VCO is modulated by an analog voltage adjusted via a feedback mechanism. Typically, the feedback mechanism is supplied from a sequential phase/frequency detector. The sequential phase/frequency detector outputs an "up" or "down" pulse proportional to phase error width and in the direction required to pull in the frequency of the VCO output signal to the target reference clock signal. The output of a sequential phase/frequency detector usually enables a charge pump driving to a loop filter (RC), which in turn controls the frequency of the VCO. The detector outputs can be arbitrarily small, and thus there is usually a dead band associated with such a detector where, for a certain window of time, there is no detectable output. Accordingly, during the dead band ("window width"), the PLL can detect neither "up" nor "down" pulses for a phase/frequency error of a magnitude equal to or less than the window width.

In today's high performance microprocessors, an emphasis is placed on low power operation without compromising the high-performance of the microprocessor. As portable applications proliferate, microprocessor designs incorporate power management techniques to reduce power and extend the battery life of portable computers. One of these techniques entails shutting down the microprocessor while statically maintaining code. This state is called low power stop (LPSTOP), where the microprocessor is completely quiescent, using no power. In portable applications, it is desirable to be able to force microprocessors in and out of the low-power states (LPSTOP) very rapidly. Historically, the largest performance penalty in cycling in and out of LPSTOP has been the amount of time the PLL requires to re-acquire phase lock. Thus, the frequency at which LPSTOP can be used is dictated by how fast a PLL can acquire (re-acquire) phase-lock. Slow lock times reduce the frequency of entering/leaving LPSTOP and result in increased power dissipation. Fast lock times increase the frequency of entering LPSTOP, and reduce power dissipation. Known analog PLL's have long lock times due to the constraints imposed upon the gain.

It is desirable in a PLL to have a frequency detector capable of very fast frequency acquisition which reduces the phase acquisition time penalty, and thereby provides rapid exit from a low-power state. In an all digital phase-locked loop (ADPLL), the VCO is replaced by a digitally-controlled oscillator (DCO). Separation of the frequency acquisition function from the phase acquisition function in the ADPLL enables the performance of each to be individually enhanced, thereby reducing the time penalty of lock acquisition. Accomplishment of this task requires a fast and accurate frequency detector. Known sequential phase/frequency detectors will not suffice since their output pulses may not always be present or may be too narrow to capture. Other known frequency detectors are essentially parallel counters where the reference clock and oscillator clock each increment the counters asynchronously. The output of these counters are compared and if there is a disparity greater than or equal to two, the frequency detector sets a "slow" or "fast" bit accordingly. A disparity of at least two is required since the initial phase error of the clocks (i.e. reference clock and oscillator clock) is unknown and could be any value less than 360 degrees (one cycle). While these frequency detectors work for a coarse resolution, they can take several cycles before a slow/fast decision is made. For high resolution (close frequencies), the approach taken by these frequency detectors requires even more cycles before an accurate frequency comparison can be obtained - essentially amortizing the penalty of a cycle of phase error and a cycle of disparity over all the cycles. Thus, it is desirable to have a frequency detector capable of performing fast and accurate frequency detection.

SUMMARY OF THE INVENTION

The present invention provides a method and apparatus for performing frequency detection. Frequency detection is accomplished using a frequency detector, coupled to an oscillator, which forces phase alignment of the oscillator to a reference clock signal and counts the oscillator pulses relative to a reference clock period. The frequency detector includes enable circuitry, coupled to the oscillator and an oscillator counter circuit. The enable circuitry enables the oscillator, synchronously with the reference clock signal, to generate an oscillator output signal. The counter circuit serially counts a number of signal transitions of the oscillator output signal, relative to a predefined number of transitions of the reference clock signal, and provides a count output signal indicating whether the number of signal transitions is less than or greater than a target number. A synchronizer, coupled to the counter circuit, receives the count output signal and generates, during the predefined reference clock interval, a first control signal when said count output signal is less than said target number, or a second control signal when the count output signal is greater than said target. The synchronizer is used to pass the counter output signal to ensure no metastability. A delay circuit, coupled to the enable circuitry, matches a delay inherent in the counter circuitry with a propagation delay relative to the reference clock signal. The oscillator is then disabled to allow adjustments to its frequency to be made, while the frequency detector is reset for another detection cycle. The frequency detector is capable of making an accurate frequency-fast, or frequency-slow decision each detection cycle.

DETAILED DESCRIPTION OF A PREFERRED EMBODIMENT

Figure 1:
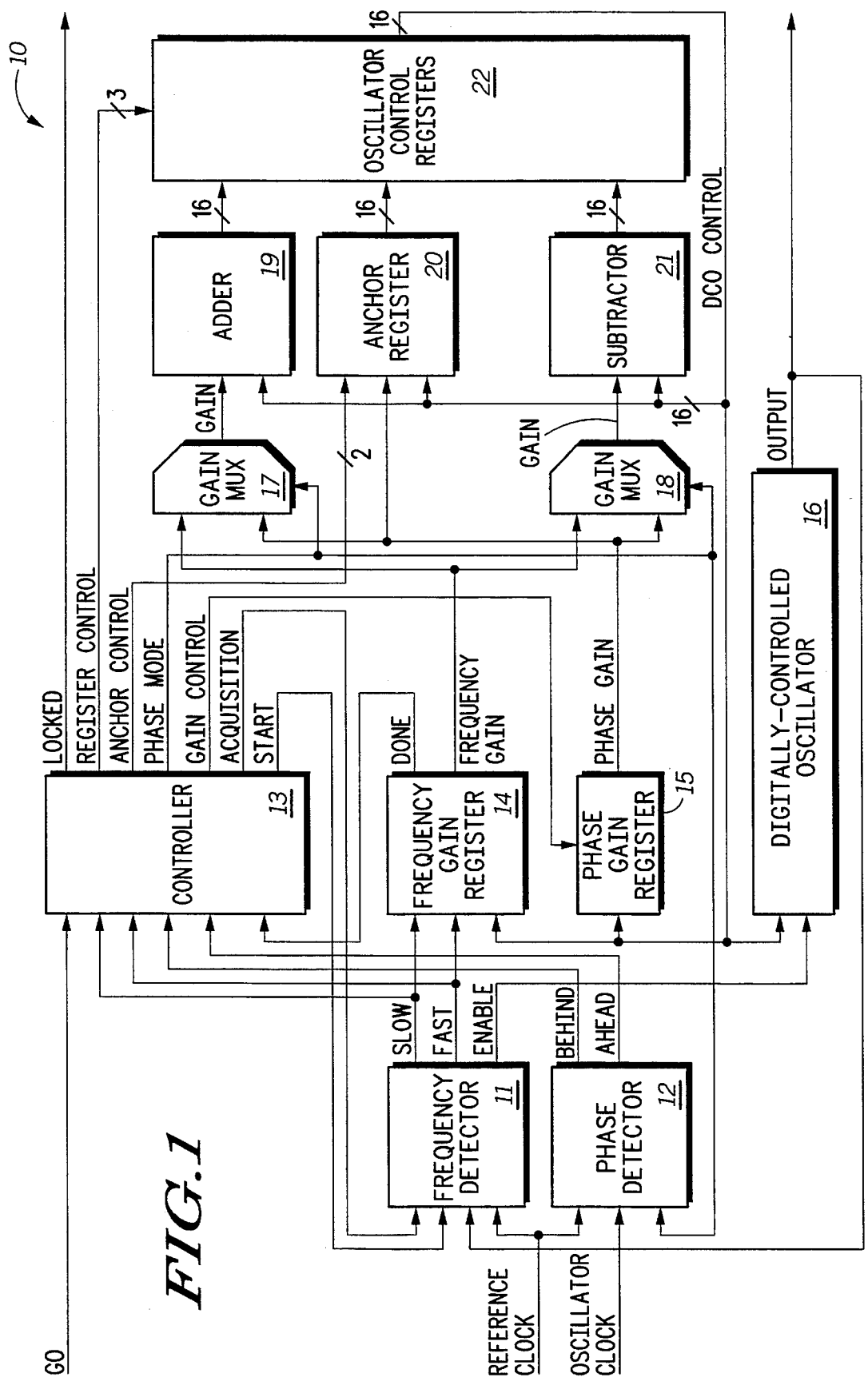
FIG. 1 illustrates in block diagram form an all digital phase-locked loop in accordance with a preferred embodiment of the present invention.

The present invention can be more fully described with reference to FIGS. 1–4. Illustrated in FIG. I is a block diagram of an all digital phase-locked loop (ADPLL) 10, in accordance with a preferred embodiment of the present invention. In a preferred embodiment, the ADPLL 10 has four modes of operation, frequency acquisition, phase acquisition, phase maintenance and frequency maintenance. The ADPLL 10 includes a frequency detector 11, a phase detector 12, a controller 13, frequency and phase gain registers 14 and 15, respectively, a digitally-controlled oscillator (DCO) 16, gain multiplexors 17 and 18, adder 19, anchor register 20, and subtractor 21. The DCO 16 uses a sixteen bit binarily-weighted control signal (DCO CONTROL) to implement changes to the frequency and phase of the DCO output, as disclosed in a patent application entitled "Delay Element with Digitally Controllable Gain" Ser. No. 07/993,757, by Lundberg et al. filed on Dec. 21, 1992 and assigned to the assignee hereof. The binary value of these control signals determines the frequency of the DCO 16. The DCO 16 has a gain which is defined as dF/d(DCO CONTROL). Thus, the larger the change in the binary value held by the DCO CONTROL signals, the larger the change in the frequency of the DCO 16. Accordingly, the frequency of the DCO 16 is changed via arithmetic increments or decrements to the sixteen control bits of the DCO CONTROL signal.

The ADPLL 10 starts in the frequency acquisition mode. In the frequency acquisition mode, the DCO control register 22 is initialized to a value of $4000 (where "$" refers to a hexadecimal value), in accordance with a preferred embodiment. Starting with a frequency gain of $2000, provided by the frequency gain register 14, and using a modified binary search algorithm, the DCO control register 22 is updated based on the output signal provided by the frequency detector 11. During frequency acquisition, the frequency detector 11 performs a digital frequency comparison between the reference clock signal and the OUTPUT signal provided by the DCO 16, and outputs a FAST or SLOW signal every two reference clock cycles (every other reference clock boundary). The FAST or SLOW digital signal initiates an increment or decrement to the DCO control register 22. The magnitude of the increments or decrements to the DCO control register 22 (the frequency gain), is dictated by the frequency gain register 14. In a preferred embodiment, gain is reduced every time a change in search direction occurs (i.e. a shift in the frequency gain register 14 occurs). Accordingly, one shift in the frequency gain register 14 causes a reduction in frequency gain by a factor of four, but only for one of either the subtract gain value or the add gain value. On successive shifts, gain reduction alternates between the add gain value and the subtract gain value. On every change in search direction, the frequency gain is reduced by a factor of two, as illustrated in Table I below.

In accordance with a preferred embodiment of the present invention, there is a one-to-one mapping of frequency gain weights to DCO CONTROL weights; for instance, an add gain value of $4000 would present an increment to the DCO CONTROL value of 100% if the DCO CONTROL value was $4000, as demonstrated in the first frequency detect cycle of Table I. When the frequency gain value stored in the frequency gain register 14 is less than the DCO CONTROL value stored in the DCO control register 22 bit-shifted right by ten bit positions, a frequency match has occurred between the reference clock signal and the output of the DCO 16 to an error of one in 210 or +/−0.1%. The ADPLL 10 then completes frequency acquisition by transferring the value in the DCO control register 22 to the anchor register 20, thereby storing the baseline frequency value in the anchor register 20.

TABLE I

| Frequency Detector Output/Cycle | | Add Gain | Subtract Gain | DCO CONTROL |
|---|---|---|---|---|
| Initial | | $4000 | $2000 | $4000 |
| Cycle 1. | SLOW | | | |
| Result: | | $4000 | $2000 | $8000 |
| Cycle 2. | FAST | | | |
| Result: | | $1000 | $2000 | $6000 |
| Cycle 3. | SLOW | | | |
| Result: | | $1000 | $800 | $7000 |
| Cycle 4. | SLOW | | | |
| Result: | | $1000 | $800 | $8000 |
| Cycle 5. | FAST | | | |
| Result: | | $400 | $800 | $7800 |
| Cycle 6. | SLOW | | | |
| Result: | | $400 | $200 | $7C00 |
| Cycle 7. | FAST | | | |
| Result: | | $100 | $200 | $7A00 |
| Cycle 8. | SLOW | | | |
| Result: | | $100 | $80 | $7B00 |
| Cycle 9. | SLOW | | | |
| Result: | | $100 | $80 | $7C00 |
| Cycle 10. | FAST | | | |
| Result: | | $40 | $80 | $7B80 |

Phase acquisition aligns the buffered output (divided by two) of the DCO 16 to the reference clock signal. Using the output of the DCO 16 rather than a global clock has two benefits. First, the global clock(s) can be turned off to save power during phase lock. Second, since the DCO 16 output runs at two times the reference clock frequency, the maximum phase error is reduced from 180° to 90°. During phase acquisition, on the rising edge of every reference clock signal, the phase detector 12 outputs a digital signal "AHEAD" or "BEHIND". The DCO control register 22 is incremented or decremented (in one direction only) every cycle by the gain value stored in the phase gain register 15, until a change in polarity of the phase error is detected. The phase gain register 15 dictates the magnitude of phase corrections. In the preferred embodiment, the phase gain register 15 performs a bit-shift right of the binary (DCO CONTROL) value currently held in the DCO control register 22, and stores this bit-shifted (gain) value of the DCO CONTROL value (base frequency). For a maximum phase error of 90°, the number of required phase corrections, n, as a function of shift displacement, d, can be approximated by equation 1.1 below:

$$n = \frac{-1 + \sqrt{1 + 2^{(d+1)}}}{2} \qquad \text{Eqn. 1.1}$$

Upon detecting the change in the polarity of the phase error, the ADPLL 10 completes phase lock by loading the value stored in the anchor register 20 into the DCO control register 22, thereby restoring the DCO control register 22 to the baseline frequency.

When phase acquisition is complete, phase-locking has been achieved, and the ADPLL 10 enters a phase/frequency maintenance mode of operation. During phase maintenance, the DCO control register 22 is incremented or decremented every cycle (based on the output of the phase detector 12) by the gain value stored in the phase gain register 15, unless a change in the polarity of the phase error is detected. If a change in the polarity of the phase error is detected, the value stored in the anchor register 20 is loaded into the DCO control register 22 to restore the baseline frequency. Also, when a change in phase error polarity is detected, the shift displacement of the phase-gain register 15 is incremented (unless the shift displacement is at a maximum value), thereby reducing the phase gain by a factor of two. In a preferred embodiment, if a change in polarity is not detected for eight consecutive phase cycles, the phase gain shift displacement is decremented (unless the shift displacement is at a minimum value), thereby increasing the phase gain by a factor of two. This mechanism allows the phase gain to change as operating conditions warrant.

Frequency maintenance occurs simultaneously with phase maintenance. In accordance with the preferred embodiment, the anchor register 20 is updated during frequency maintenance, thereby changing the baseline frequency of operation of the DCC) 16. After phase acquisition, if four consecutive increments of the DCC) control register 22 occur, then the anchor register 20 is incremented once by the phase gain value stored in the phase gain register 15. Similarly, if four consecutive decrements of the DCO control register 22 occur, the anchor register 20 is decremented once by the phase gain value. This mechanism allows the baseline frequency to track as operating conditions change with time.

Figure 2:
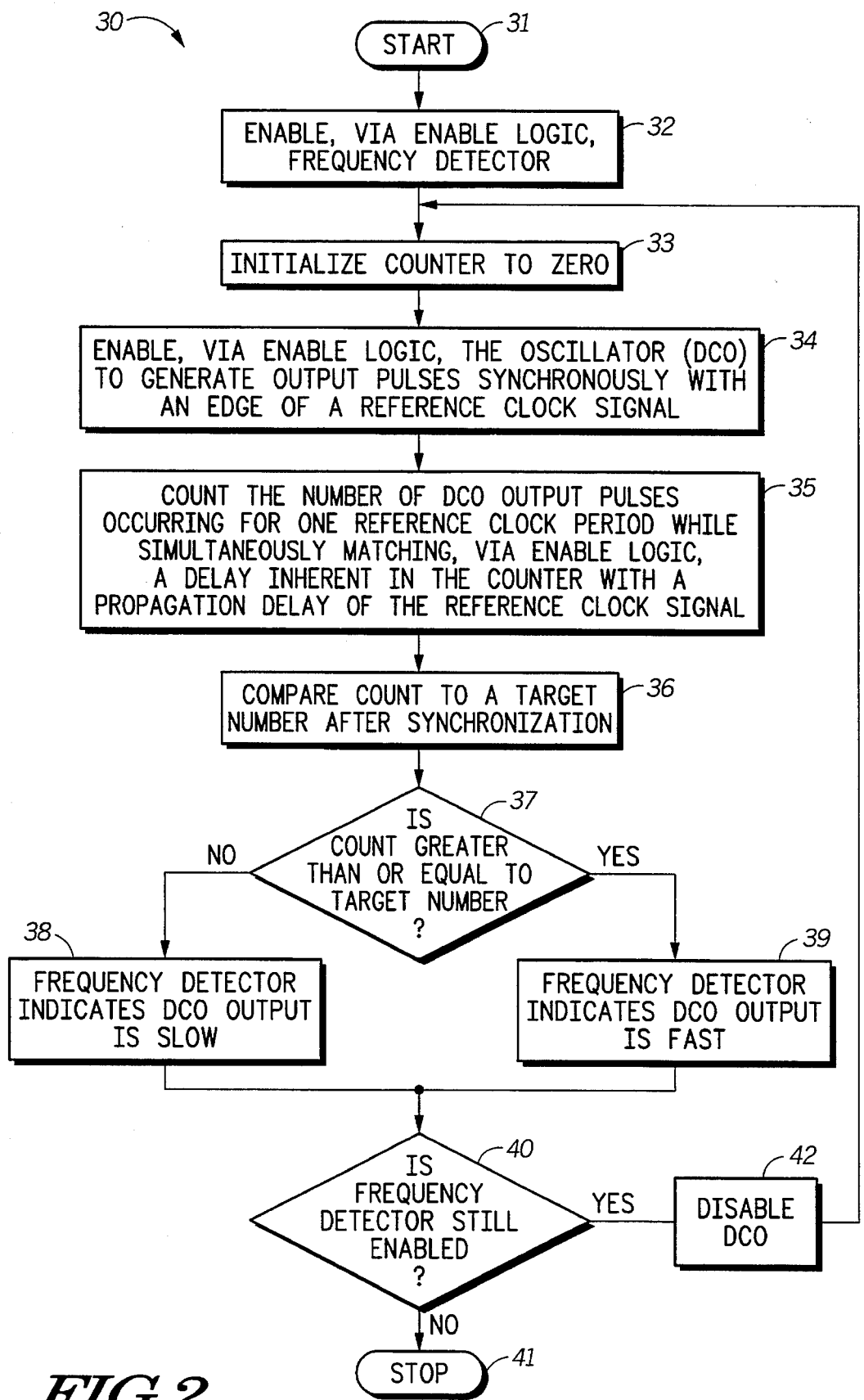
FIG. 2 illustrates a flow diagram for performing frequency detection, using the all digital phase-locked loop of FIG. 1, in accordance with the present invention.
Figure 3:
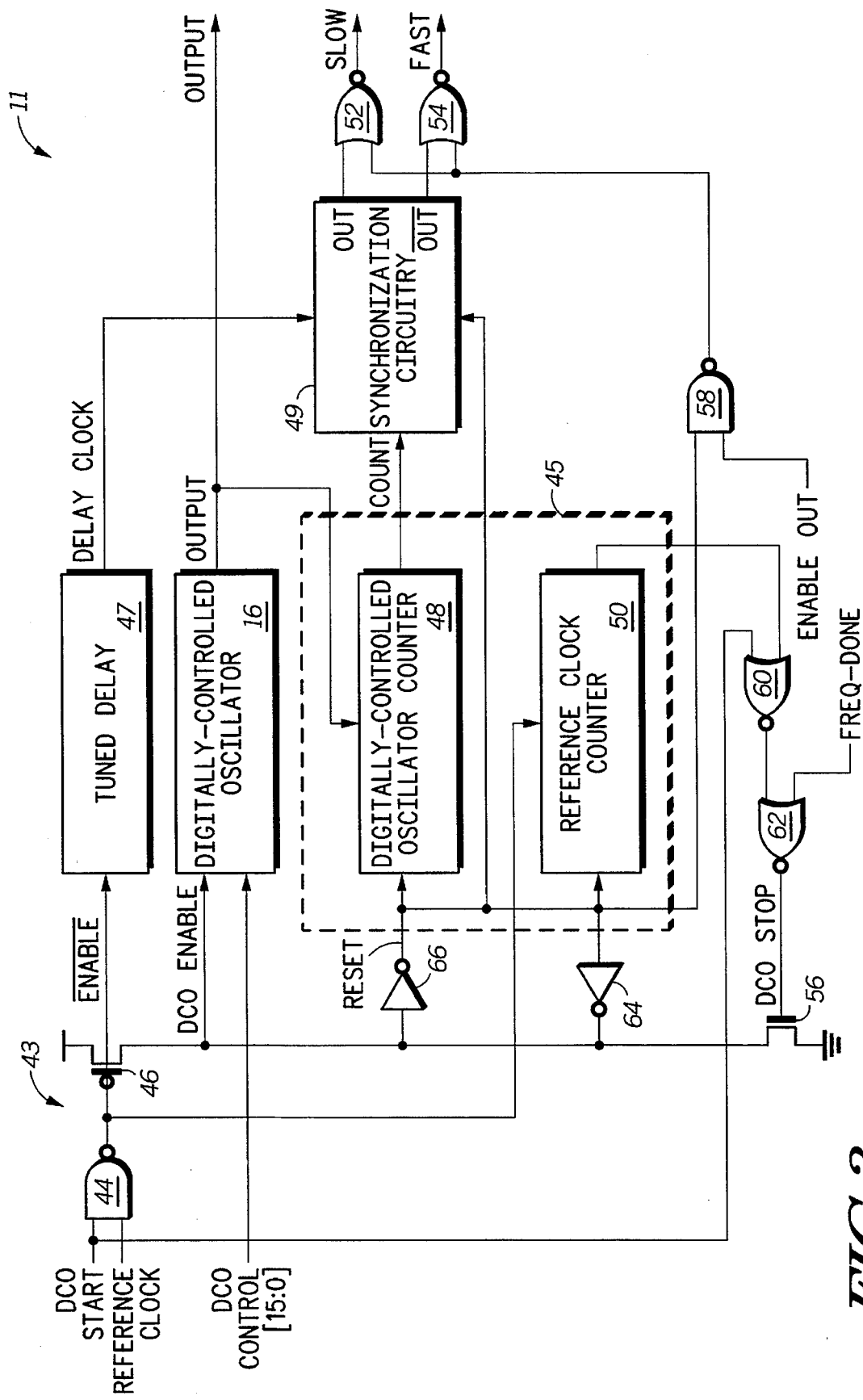
FIG. 3 illustrates in block diagram form a frequency detector, in the all digital phase-locked loop of FIG. 1, for performing frequency detection in accordance with the present invention.

Illustrated in FIG. 2 is a flow diagram 30 for performing frequency detection that may be used to implement the present invention. The frequency detector 11 is connected to the DCO 16, as illustrated in FIG. 3. In a preferred embodiment of the present invention, the frequency detector 11 includes enable logic circuitry 43, counter circuitry 45, delay circuitry 47, and synchronization circuitry 49. The operation of the frequency detector 11 in performing frequency detection can be more fully described with reference to FIGS. 2 and 3. At step 32 (FIG. 2) the frequency detector 11 is enabled via the assertion by an external source (not shown) of a DCO START signal synchronous to the REFERENCE CLOCK signal. The assertion of the DCO START signal must occur during an interval wherein the REFERENCE CLOCK signal, in conjunction with the START signal, cannot enable the DCO 16. This precaution ensures that the frequency detector 11 does not count DCO pulses for an abbreviated reference clock period, thereby causing the frequency detector 11 to output an erroneous result.

At step 33, the DCO counter 48 (FIG. 3) is initialized to zero, to ensure that the frequency detector 11 makes an accurate count. At step 34, the DCO 16 is enabled, via the enabled logic circuitry 43, by a transition of the REFERENCE CLOCK signal. Once the DCO 16 is enabled, it begins to output pulses (OUTPUT) as a ring oscillator. Since the DCO 16 was enabled synchronously with a transition of the REFERENCE CLOCK signal, the first OUTPUT pulse is phase aligned with the REFERENCE CLOCK signal. The DCO counter 48 counts the number of oscillator OUTPUT pulses, at step 35. On the next transition of the reference CLOCK signal, one reference clock period later, the output value of the DCO counter 48 is captured, via a flip-flop (not shown) in the synchronization circuitry 49 clocked by the transition of the REFERENCE CLOCK signal. In accordance with a preferred embodiment, the transition of the REFERENCE CLOCK signal at the flip-flop is delayed, via a tuned delay circuit 47 (FIG. 3), to match the delay inherent in enabling the DCO 16 with the delay inherent in the DCO counter 48. This results in the count captured by the synchronizer 49 being highly accurate.

At step 36, the captured count must be synchronized to preclude the propagation of a metastable value. In a preferred embodiment, synchronization circuitry 49 (FIG. 3) is used as capture logic, and is, therefore, clocked by the transition of the REFERENCE CLOCK. After synchronization, the count value (COUNT) is compared with a target number, at step 37. The target number represents the number of oscillator output pulses that should occur in one reference clock period. If the captured COUNT value is less than the target number, the DCO 16 is running slower than the target frequency, and the frequency detector 11 will so indicate at step 38. Conversely, if the captured COUNT value is greater than or equal to the target number, the DCO 16 is running faster than the target frequency, and the frequency detector 11 will so indicate at step 39. Since only an integer number can be captured, via the synchronization circuitry 49, a COUNT value that is greater than or matches the target can indicate that the DCO 16 is negligibly faster than the target or grossly faster. Similarly, a COUNT value that is less than the target can indicate that the oscillator is negligibly slower or grossly slower than the target. Consequently, if very small changes are being made to the frequency and the frequency detector 11 changes from indicating FAST to indicating SLOW on consecutive detection cycles (or vice versa), then this is an indicator that the DCO 16 is at the target frequency or negligibly close to the target frequency.

In a preferred embodiment, the frequency detector 11 is disabled after the ADPLL 10 completes frequency acquisition, at step 40. As described earlier, frequency acquisition occurs when the frequency of the DCO 16 matches the target frequency or is negligibly close to the target frequency. Accordingly, at step 41 the frequency detector 11 is stopped, after frequency acquisition occurs; however, the DCO 16 continues to run. If frequency acquisition is not complete, the DCO 16 is disabled at step 42, in preparation for another detection cycle. This is accomplished by asserting the DCO STOP signal. The assertion of the DCC) STOP signal must occur during an interval wherein the REFERENCE CLOCK signal, in conjunction with the START signal, cannot enable the DCC) 16. This protocol ensures that there will be no conflict between the NAND-gate 44 and transistor 43 attempting to enable the DCO 16, while the NOR-gate 62 and transistor 56 are attempting to disable the DCO 16.

In a preferred embodiment of the present invention, the DCO counter 48, illustrated in FIG. 3, is a serial shift register clocked by the DCO OUTPUT signal. For a DCO 16 target frequency of four times the reference clock frequency, the serial shift register requires five shifts to assert COUNT at the output of the DCO counter 48. In general, for a given target frequency (as a multiple of the reference clock frequency), the required number of shifts to assert the COUNT signal equals one plus the target number (1+target). A reference clock counter 50 counts the number of reference clock edges. After 1.5 reference clock periods, the output of the reference clock counter 50 is asserted, which results in the assertion of the DCO STOP signal. In response to the assertion of the DCO STOP signal, transistor 56 becomes conductive, thereby causing the de-assertion of the DCC) ENABLE signal. The de-assertion of the DCO ENABLE signal disables the DCC) 16, and causes the assertion of the RESET signal, thereby resetting counters 48 and 50. The assertion of the RESET signal causes the de-assertion of the DCO STOP signal.

Initially, the DCO START signal is asserted at the input to NAND-gate 44 by an external source (not shown), after the falling edge of the REFERENCE CLOCK signal. This causes the NAND-gate 44 to assert the DCO ENABLE signal on the next rising edge of the REFERENCE CLOCK signal. The assertion of the DCC) ENABLE signal results in the de-assertion of the RESET signal to the counters 48 and 50. Since the output of the reference clock counter is low, NOR-gate 60 and NOR-gate 62 operate to de-assert the DCO STOP signal, causing the N-channel transistor 52 to become non-conductive. The DCC) ENABLE signal remains de-asserted due to the weak feedback inverter 64. On the next rising edge of the REFERENCE CLOCK signal, the output of NAND gate 44 will go low, asserting the ENABLE signal and turning on the P-channel transistor 46. When transistor 46 becomes conductive, the DCO ENABLE is asserted, enabling the DCO 16 and de-asserting the RESET signal to counters 48 and 50. The DCO 16 has been synchronously enabled with the rising edge of the REFERENCE CLOCK signal, thus forcing phase alignment between the DCO OUTPUT signal and the REFERENCE CLOCK signal.

As previously indicated, the synchronization circuitry 49 captures the assertion (or de-assertion) of the COUNT signal. Optimally, the assertion of the COUNT signal occurs at or about the rising edge of the REFERENCE CLOCK signal, as illustrated in the timing diagram 70 of FIG. 4. A possibility exists, therefore, for a metastable state to propagate. The present invention uses a two-stage synchronizer so that the possibility of an occurrence of a metastable state becomes negligibly small. The tuned delay circuitry 47 matches the delay inherent in the enable circuitry 43 with the delay inherent in the DCO counter 48, and provided a DELAY CLOCK signal to the synchronization circuitry 49. Thus, if the DCO 16 were running at exactly the target frequency, the arrival of the assertion of the COUNT would be coincident with the arrival of the rising edge of the DELAY CLOCK signal at the synchronization circuitry 49. The rising edge of the DELAY CLOCK signal is used by the synchronization circuitry 49 to capture the COUNT value.

Figure 4:
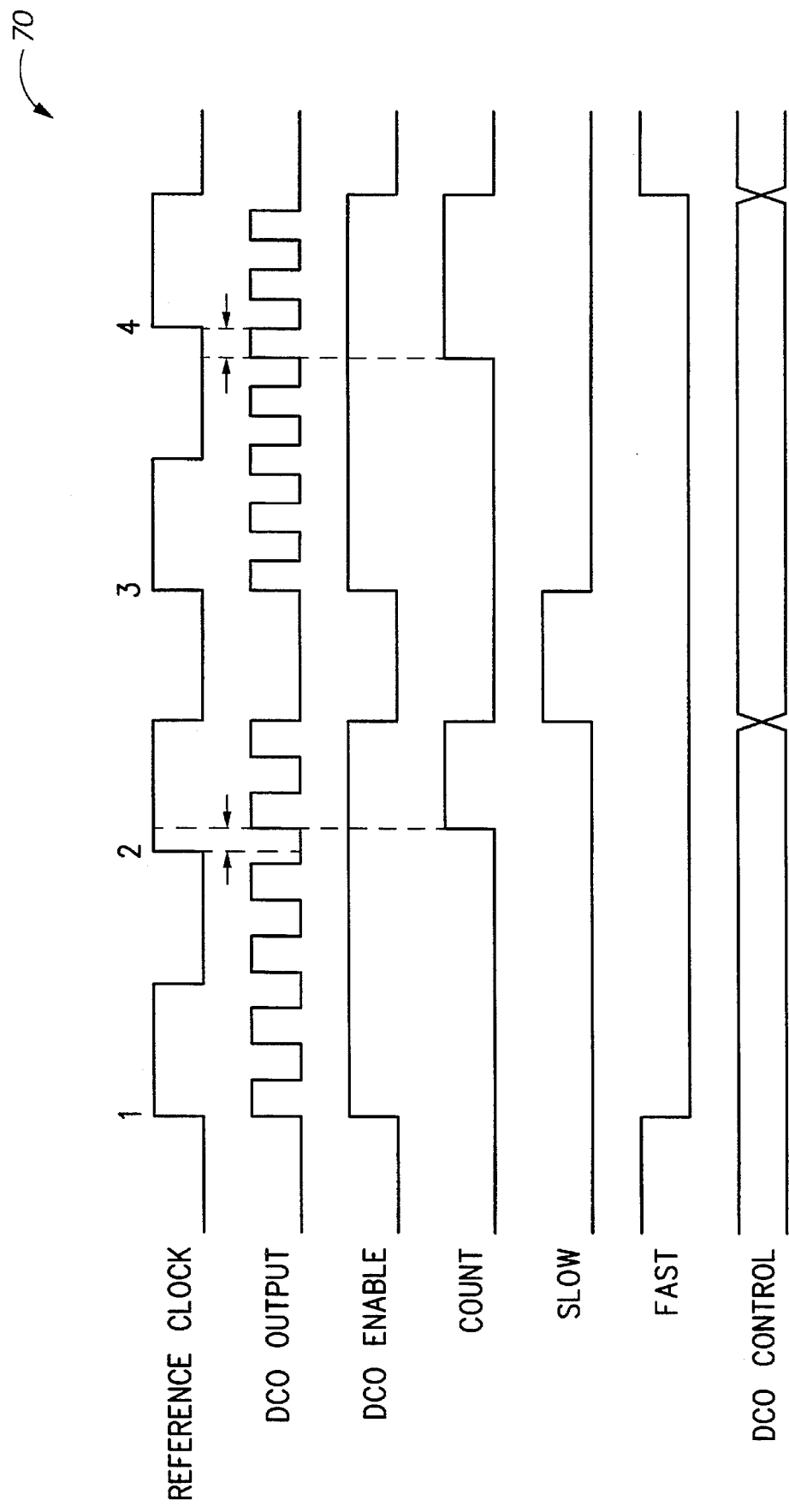
FIG. 4 illustrates a timing diagram depicting two frequency detect cycles, as performed by the frequency detector of FIG. 3.

Illustrated in FIG. 4 is a timing diagram 70 depicting two frequency detect cycles, as performed by the frequency detector 11 in accordance with the present invention. As illustrated by diagram 70, in the first cycle the frequency detector 11 detects that the DCO OUTPUT is slow, whereas, in the second cycle the DCO OUTPUT is fast. The first detection cycle starts on the rising edge of the first REFERENCE CLOCK signal, and causes the assertion of the DCO ENABLE as previously described. The DCO ENABLE signal enables the DCO 16 and the counter logic circuitry 45. In response to the assertion of the DCO ENABLE signal, the output (DCO OUTPUT) of the DCO 16 begins to toggle. The output pulses of the DCO 16 are counted by the DCO counter 48, which asserts a COUNT signal after a predefined number of pulses (e.g. five). On the rising edge of the next REFERENCE CLOCK signal (i.e. one reference clock period later), the value of the COUNT signal is captured by the synchronization circuitry 49.

A logic low COUNT signal indicates that there are less than the predefined number (e.g. five) of DCO OUTPUT pulses during the reference clock period. Conversely, a logic high COUNT signal indicates that the number of DCO OUTPUT pulses, during the reference clock period, equals to or exceeds such predefined number. In the first detection cycle, the COUNT signal is asserted by the DCO counter 48 after the fifth rising edge of the DCO OUTPUT signal. As illustrated, the COUNT signal is asserted after the second rising edge of the REFERENCE CLOCK signal, therefore, a COUNT "low" is captured and synchronized by the synchronization circuitry 49. After the next falling edge of the REFERENCE CLOCK signal, the synchronization of COUNT "low" is complete, resulting in the assertion, by the synchronization circuitry 49, of the SLOW signal, via NOR-gate 52. When the SLOW signal is asserted (during the second reference clock period), and when the REFERENCE CLOCK signal transitions low, the DCO ENABLE signal is asserted by the enable logic circuitry 44, thereby causing the DCO 16 to stop and the counter circuitry 50 to reset. During this interval, the DCO CONTROL value can be updated, thereby changing the frequency of operation of the DCO 16. The frequency detector 11 is now ready for the next detection cycle.

In a preferred embodiment of the present invention, the second frequency detection cycle begins on the third rising edge of the REFERENCE CLOCK signal, as illustrated in FIG. 4. The second detection cycle is similar to the first, with the exception that the fifth rising edge of the DCO OUTPUT signal triggers the assertion of the COUNT signal before the next rising edge (i.e. the fourth rising edge) of the REFERENCE CLOCK signal. Thus, a COUNT "high" is captured by the synchronization circuitry 49. Consequently, after COUNT "high" is synchronized, a FAST signal is asserted by the synchronization circuitry 49, via NOR-gate 54. The FAST signal indicates that there are four or more DCO OUTPUT pulses in one reference clock period, and that the DCO needs to be slowed down. Once again, the DCO 16 is stopped, via the enable logic circuitry 43, the counter circuitry 50 is reset, and the DCO CONTROL value is updated to thereby adjust the frequency of operation of the DCO 16.

Accordingly, the present invention enables the ADPLL 10 to perform fast frequency detection. Whereas analog phase-locked loops combine phase and frequency acquisition into the lock process, the present invention allows for the separation of frequency acquisition from phase acquisition and thereby reduces the time penalty associated with lock acquisition. The frequency detector of the present invention achieves fast frequency detection by forcing phase alignment of the oscillator to the reference clock.

While the present invention has been described in accordance with a preferred embodiment, it should be apparent to one of ordinary skill in the art that the invention may be practiced in numerous ways. For example, although the preferred embodiment uses a full cycle for resetting the frequency detect mechanism (counter logic circuitry 45), the frequency detect mechanism may be reset in a minimum of one-half cycle to perform the next frequency comparison. Furthermore, in the preferred embodiment described herein the frequency detector 11 is shown detecting an output of a digitally controlled oscillator, however, the frequency detector 11 of the present invention may also detect an output of a voltage-controlled oscillator. Accordingly, it is intended by the appended claims to cover all modifications of the invention which fall within the true spirit and scope of the invention.

We claim:

1. In a system having a clock generator for generating a reference clock signal and an oscillator for performing frequency synthesis, a frequency detector for comparing a frequency of the reference clock signal to an oscillator output signal, said frequency detector comprising:

counter circuitry for serially counting a number of signal transitions of said oscillator output signal, relative to a predefined number of transitions of said reference clock signal, and for providing a count output signal indicating whether the number of signal transitions of said oscillator output signal is less than or not less than a target number, said counter circuitry comprising;

a first counter having an input for receiving said oscillator output signal and an output for providing said count output signal indicating whether the number of signal transitions of said oscillator output, relative to a predefined number of transitions of said reference clock signal, is less than or not less than a target number; and a reference clock counter for counting said predefined number of transitions of said reference clock signal, and for providing a reset signal to reset said first counter to an initial value;

synchronization circuitry, coupled to said counter circuitry, for receiving said count output signal and for generating, during a predefined reference clock interval, a first control signal when said count output signal is less than said target number, or a second control signal when said count output signal is not less than said target;

a delay circuit, coupled to said enable circuitry, for matching a delay inherent in the counter circuitry with a propagation delay relative to the reference clock signal; and enable circuitry, coupled to said oscillator and said counter circuitry, for receiving the reference clock signal and a start signal, and providing an enable signal, in response thereto, to force said oscillator to generate said oscillator output signal synchronously with the reference clock signal, said enable circuitry resetting said first counter in response to receiving said reset signal from said reference clock counter, and resetting said oscillator during said predefined reference clock interval.

2. The system of claim 1 wherein said enable circuitry comprises:

a first logic portion having an input for receiving said reference clock signal and a first oscillator control signal, and an output for enabling said oscillator to generate said oscillator output signal, synchronously with said reference clock signal, and for resetting said counter circuitry; and a second logic portion having an input for receiving said reset signal provided by said reference clock counter, and an output for disabling said oscillator.

3. In a system having a clock generator for generating a reference clock signal and an oscillator for performing frequency synthesis, a frequency detector for comparing a frequency of the reference clock signal to an oscillator output signal, said frequency detector comprising: enable circuitry, coupled to said oscillator, for receiving the reference clock signal and a start signal, and providing an enable signal, in response thereto., to force said oscillator to generate said oscillator output signal synchronously with the reference clock signal;

counter circuitry for serially counting a number of signal transitions of said oscillator output signal, relative to a predefined number of transitions of said reference clock signal, and for providing a count output signal indicating the number of signal transitions of said oscillator output signal,, a first counter for serially counting a number of signal transitions of said oscillator output signal, relative to a predefined number of transitions of said reference clock signal, said first counter having an input for receiving said oscillator output signal and an output for providing said count output signal indicating whether the number of signal transitions of said oscillator output., relative to a predefined number of transitions of said reference clock signal, is less than or not less than a target number; and a reference clock counter for counting said predefined number of transitions of said reference clock signal, and for providing a reset signal to reset said first counter to an initial value;

synchronization circuitry, coupled to said first counter and the enable circuitry, for receiving said count output signal and for generating, during a predefined reference clock interval, a set of binary signals indicating whether said number of signal transitions of said oscillator output signal is at least a predefined integer number, said enable circuitry resetting said first counter, said reference clock counter and said oscillator during said predefined reference clock interval; and a delay circuit, coupled to said enable circuitry, for matching a delay inherent in the first counter with a propagation delay relative to the reference clock signal.

4. The system of claim 3 wherein said enable circuitry comprises:

a first logic portion having an input for receiving said reference clock signal and a first oscillator control signal, and an output for enabling said oscillator to generate said oscillator output signal, synchronously with said reference clock signal, and for resetting said counter circuitry; and a second logic portion having an input for receiving said reset signal provided by said reference clock counter, and an output for disabling said oscillator.

5. In a system having a clock generator for generating a reference clock signal, an oscillator for performing frequency synthesis, a synchronization circuitry coupled to a counter, and enable logic circuitry coupled to said synchronization circuitry and said oscillator, a method for performing frequency detection comprising the steps of:

forcing phase alignment of said oscillator output signal to said reference clock signal by enabling, via said enable logic circuitry said oscillator to generate said oscillator output signal , synchronously with the reference clock signal;

serially counting, via said counter, a number of signal transitions of said oscillator output signal, relative to a predefined number of transitions of said reference clock signal, and providing a count output signal indicating whether the number of signal transitions of said oscillator output signal is less than or not less than a target number;

matching, via said enable logic circuitry, a delay inherent in the counter and the enable logic circuitry with a propagation delay relative to the reference clock signal;

receiving, via said synchronization circuitry, said count output signal and generating, during a predefined reference clock interval, a first control signal, when said count output signal is less than said target number, or a second control signal when said count output signal is not less than said target; and resetting, via said enable logic circuitry, said counter circuitry and said oscillator during said predefined reference clock interval.

6. The method of claim 5 wherein the step of enabling said oscillator to generate an oscillator output signal, synchronously with the reference clock signal comprises the step of receiving said reference clock signal and a first oscillator control signal, and providing an oscillator enable signal in response thereto.

7. The method of claim 5 wherein the step of serially counting a number of signal transitions of said oscillator output signal, relative to a predefined number of transitions of said reference clock signal, and providing a count output signal indicating whether the number of signal transitions of said oscillator output signal is less than or not less than a target number comprises the steps of:

counting said predefined number of transitions of said reference clock signal; and receiving, via said counter, said oscillator output signal and said reference clock signal, and providing said count output signal indicating the number of signal transitions of said oscillator output, relative to said predefined number of transitions of said reference clock signal.

8. The system of claim 1 wherein said delay circuit matches said delay inherent in the counter circuitry with the propogation delay relative to the reference clock signal and provides a delay clock signal to the synchronization circuitry.

9. The system of claim 1 wherein said first counter comprises a serial shift register clocked by said oscillator output signal.

10. The system of 1 wherein said synchronization circuitry comprises a two-stage synchronizer.

11. The system of claim 3 wherein said delay circuit matches said delay inherent in the counter circuitry with the propogation delay relative to the reference clock signal and provides a delay clock signal to the synchronization circuitry.

12. The system of claim 3 wherein said first counter comprises a serial shift register clocked by said oscillator output signal.

13. The system of 3 wherein said synchronization circuitry comprises a two-stage synchronizer.

* * * * *

UNITED STATES PATENT AND TRADEMARK OFFICE
CERTIFICATE OF CORRECTION

PATENT NO. : 5,511,100
DATED : April 23, 1996
INVENTOR(S) : James R. Lundberg; Charles E. Nuckolls It is certified that error appears in the above-identified patent and that said Letters Patent is hereby corrected as shown below:

Column 10, line 11, after the word "thereto" delete the [.]

Column 10, line 14, delete the entire paragraph beginning with [counter circuitry for serially counting a number]

Column 10, line 26, after the word "output" delete the [.]

Signed and Sealed this

Seventeenth Day of March, 1998

Attest:

BRUCE LEHMAN

Attesting Officer

Commissioner of Patents and Trademarks